United States Patent [19]

Oguro

[11] Patent Number: 5,371,039
[45] Date of Patent: Dec. 6, 1994

[54] METHOD FOR FABRICATING CAPACITOR HAVING POLYCRYSTALLINE SILICON FILM

[75] Inventor: Shizuo Oguro, Tokyo, Japan

[73] Assignee: NEC Corporation, Shiba, Japan

[21] Appl. No.: 19,359

[22] Filed: Feb. 18, 1993

[30] Foreign Application Priority Data

Feb. 19, 1992 [JP] Japan .................................. 4-031169

[51] Int. Cl.5 .......................................... H01L 21/20
[52] U.S. Cl. .................................. 437/101; 437/186;
437/191; 437/233; 437/919; 257/377; 257/385;
257/646
[58] Field of Search ............... 437/233, 186, 191, 193,
437/967, 101, 919; 148/DIG. 122; 257/377,
385, 505, 646

[56] References Cited

U.S. PATENT DOCUMENTS

| | | | |
|---|---|---|---|
| 4,319,954 | 3/1982 | White et al. | 156/628 |
| 4,358,326 | 11/1982 | Doo | 148/174 |
| 5,025,741 | 6/1991 | Suwanni et al. | 437/52 |
| 5,135,886 | 8/1992 | Manocha et al. | 437/101 |
| 5,155,051 | 10/1992 | Noguchi et al. | 437/4 |
| 5,169,806 | 12/1992 | Hawkins et al. | 437/233 |
| 5,180,690 | 1/1993 | Czubatyj et al. | 437/233 |
| 5,192,708 | 3/1993 | Beyer et al. | 437/90 |
| 5,198,387 | 3/1993 | Tang | 437/101 |
| 5,227,329 | 7/1993 | Kobayashi et al. | 437/101 |
| 5,242,855 | 9/1993 | Oguro | 437/109 |

OTHER PUBLICATIONS

Morie, T. and Murota, J., "Trench Coverage Characteristics of Polysilicone Deposited by Thermal Decompositions of Silane," *Japanese Journal of Applied Physics*, vol. 23, No. 7, Jul. 1984, pp. L482–L484.

*Primary Examiner*—Olik Chaudhuri
*Assistant Examiner*—Ken Horton
*Attorney, Agent, or Firm*—Popham, Haik, Schobrich & Kaufman Ltd.

[57] ABSTRACT

A method of fabricating a semiconductor device, in particular of forming a polysilicon film on a step portion of an insulation film made by a trench or a contact hole is disclosed which includes the steps of depositing an amorphous silicon film on the step portion while doping impurities into the amorphous silicon film and carrying out heat treatment to convert the amorphous silicon film into a polycrystalline silicon film, thereby the polysilicon film on a step portion being formed.

4 Claims, 3 Drawing Sheets

METHOD FOR FABRICATING CAPACITOR HAVING POLYCRYSTALLINE SILICON FILM

BACKGROUND OF THE INVENTION

The present invention relates to a method for fabricating a semiconductor device and, more particularly, to a method for forming a polycrystalline silicon film or a polysilicon film.

A polysilicon film is essential to a semiconductor device. For example, the polysilicon film is used for an electrode of a capacitor provided in an insulating film covering a semiconductor substrate or conductive material for filling a contact hole provided in the insulating film. In that case, the polycrystalline silicon film is required to be deposited on a step portion of the insulating film made by the capacitor or the contact hole. The polysilicon film is further required to dope impurities therein to lower the resistivity thereof.

In order to decrease the steps in fabrication, it was reported in "JAPANESE JOURNAL OF APPLIED PHYSICS", vol. 23, No. 7, Jul. 1984, pp. L482–L484, that an impurity doping gas is introduced during the growth of the polysilicon film. The polysilicon film is thus grown on the step portion of the insulating film while doping impurities thereinto. This method is called hereinafter "in situ doping method".

However, the so-called step coverage of the doped polycrystalline silicon film thus made is very poor, so that the deviation of the capacitance value becomes large and the contact resistance value is made high.

SUMMARY OF THE INVENTION

It is, therefore, an object of the present invention is to provide a method for forming a polycrystalline silicon film having impurities with a good step coverage.

A method of forming a polysilicon larger a step portion of an insulating film is featured by growing an amorphous silicon film on the surface of the trench portion in place of directly growing a polysilicon film, followed by heat treatment to convert the amorphous silicon film into a polycrystalline silicon film. The growth of the amorphous silicon film is preferably performed by a chemical vapor deposition method in which silane ($SiH_4$) or disilane ($Si_2H_6$) is used as a source gas and a deposition temperature is designed in the range of 450° to 550° C.

The present invention is based on the inventor's discovering that the amorphous silicon film is grown with a good step coverage even if impurities are doped while growing the amorphous silicon film.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Prior to describing in detail the present invention, the description on the prior art is made in order to facilitate the understanding of the present invention.

Figure 1A:
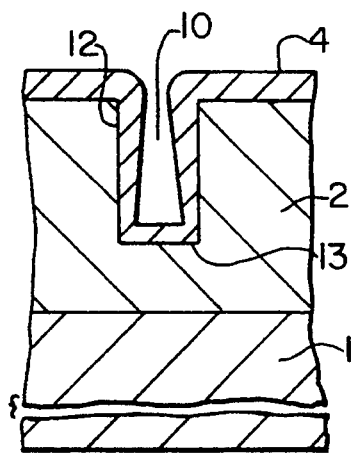
FIGS. 1a and 1b are sectional views respectively showing a part of a semiconductor device fabricated according to the prior art.

Referring to FIG. 1a, according to the prior art, a polycrystalline silicon film is deposited on well-shaped silicon oxide film 2 using a chemical vapor deposition applying silane ($SiH_4$) as a sourse gas and at deposition temperature in range of 600° to 750° C. Then, an diffusing source for impurity is formed on a surface of the film using phosphorus oxychloride ($POCl_3$), *for example. In this case, the impurity is phosphorus (P). Then, after performing heat treatment to introduce the impurity into the polycrystalline silicon film at temperature in range of* 800° to 1000° C., the diffusing source is removed and low resistance electrode is formed. Instead of the diffusion method, to simplify the doping step, the deposition is performed using the in situ doping at temperature about 600° C. applying phosphine ($PH_3$) or the like as doping gas as well as silane ($SiH_4$) as source gas. However, as shown in FIG 1a, in case of the deposited film using the in situ doping, a thickness of the film 2 formed on a bottom portion 13 of the film 2 is thinner than that of the film 2 formed on the sidewall portion 12 of the trench 10. Accordingly, a opening made and surrounded by the deposited film 4 at the trench 10 becomes narrow gradually.

Figure 2A:
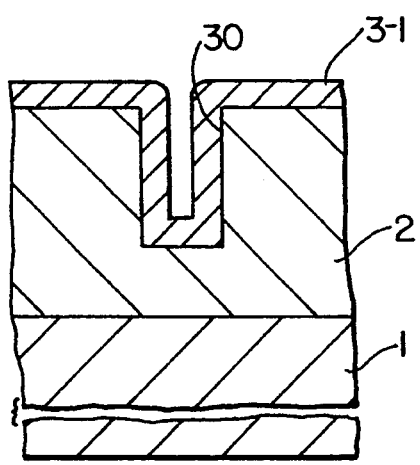
FIG. 2a and FIG. 2b are sectional views representative of an embodiment of the present invention.

Turning to FIG. 2a, according to an embodiment of the invention, a trench 30 of 1 μm of depth is formed in a silicon oxide film 2 having a thickness of 1.5 μm, followed by depositing an amorphous silicon film 3-1 on the film 2 having the trench 30. The deposition of the amorphous silicon film 3-1 is carried out by a chemical vapor deposition method using a vertical type low pressure chemical vapor deposition apparatus. In this embodiment, a disilane gas was employed as a source gas at flow rate of 100 sccm in conditions of the deposition temperature of 470° C. and the deposition pressure of 0.2 Torr. A phosphine ($PH_3$) gas diluted in 4% with a helium gas was simultaneously introduced at flow rate of 120 sccm together with a nitrogen gas at flow rate of 180 sccm. Thus, the amorphous silicon film of 200 nm in thick was deposited while doping the phosphorus impurities thereinto. Silane ($SiH_4$) may be used as the source gas.

Figure 2B:
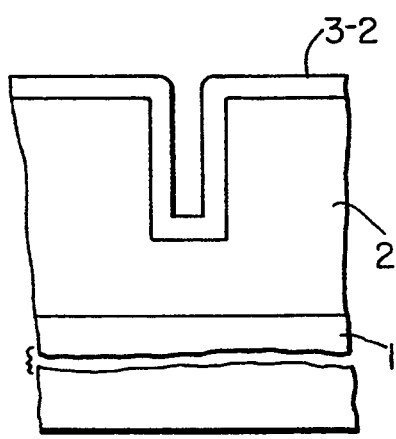

After the deposition, heat treatment is performed to crystallize amorphous silicon. The amorphous silicon 3-1 is thus converted into a polycrystalline silicon film 3-2, as shown in FIG. 2. In this embodiment, the heat treatment was carried out in a nitrogen gas at temperature of 900° C. for 20 minutes.

Figure 3:
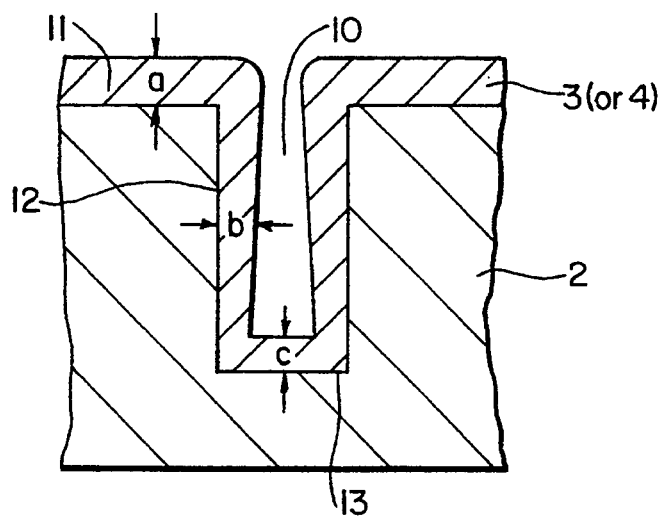
FIG. 3 shows a sectional view to explain a step coverage of a amorphous or polycrystalline silicon film deposited on a step portion.

After observing the obtained polycrystalline silicon film using a scanning electron microscope, a factor of step coverage is calculated. As shown in FIG. 3, each film thickness of the deposited frilm 3 or 4 formed on a surface of an outside portion 11 of the trench 10, on a surface of a sidewall portion 12 of the trench 10 and on a surface of a bottom portion 13 of the trench 10 is determined a, b and c, respectively in the present specification. For comparing, depositions of the polycrystalline silicon film was also performed using the conventional method. As to the in situ doping method, the deposition condition is same as the described above except that the deposition temperature is selected at 600° C. at this time. As to the diffusion method, a polycrystalline silicon film is grown at deposition temperature of 600° C. introducing disilane a flow rate of which is 100 sccm and nitrogen a flow rate of which is 300 sccm without doping. As the result of the observation, the fact is obtained that the step coverage factor by the in situ doping method is very poor such as b/a=0.37 and c/a=0.42. In addition, the step coverage factor by the diffusion method is also not so good such as b/a=0.82 and c/a=0.82. In the contrary, the method according to the present embodiment of the invention can improve the step coverage factor such as b/a=0.88 and c/a=0.90. In the embodiment, though the deposition temperature of the amorphous silicon film is selected at 470° C., the step coverage can be improved in case that the deposition temperature is selected in the range of 450° to 550° C.

Therefore, according to the present embodiment, while the impurity is doped, the step coverage can ameliorate comparing to the prior art and the embodiment can improves uniformity of the deposited film. Accordingly, the method can provides a doped polycrystalline silicon film having low resistance.

Figure 4A:
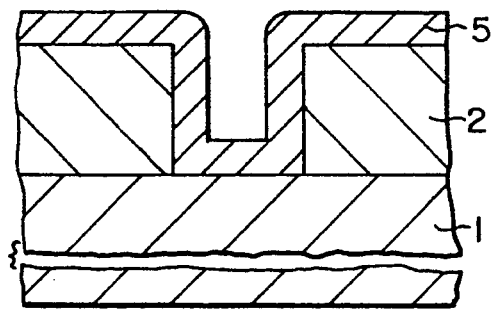
FIGS. 4a to 4c are sectional views to explain fabricating steps of a capacitor as a application of the present invention is applied.
Figure 4B:
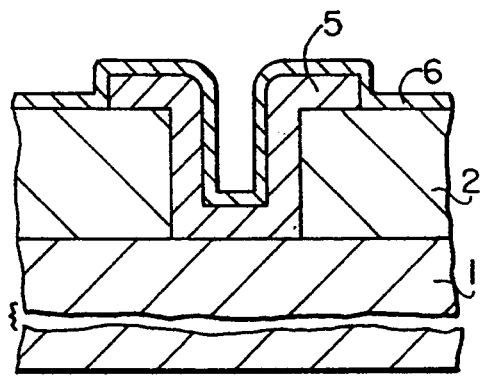
Figure 4C:
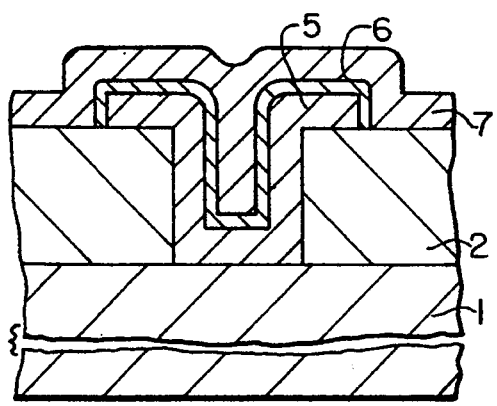

Referring to FIGS. 4a to 4c, a case which the present embodiment of the invention is applied to electrodes for a semiconductor memory device will be explained. As shown in FIG. 4a, a silicon oxide film 2 having a well-shaped opening of 1 $\mu m^2$ area and 1 $\mu m$ in deep is formed on a silicon substrate 1. Then, an amorphous silicon film with thickness of 200 nm for a bottom electrode 5 is deposited while doping impurities therein. The fabrication condition is the same as described above. Them, as shown in FIG. 4b, a dielectric film 6 such as silicon oxide and/or silicon nitride with thickness of 10 nm is grown on it. After selectively removing the film 6, as shown in FIG. 4c, another amorphous silicon film for an upper electrode 7 is deposited on the film 6 while doping impurities therein. Then, the amorphous silicon films 5 and 7 are crystallized by heat treatment at temperature of 900° C. for 20 minutes to be converted into a polysilicon layer, respectively. Thus, a capacitor having a bottom electrode (5), an upper electrode (7) and a dielectric film 6 therebetween is obtained.

Figure 5A:
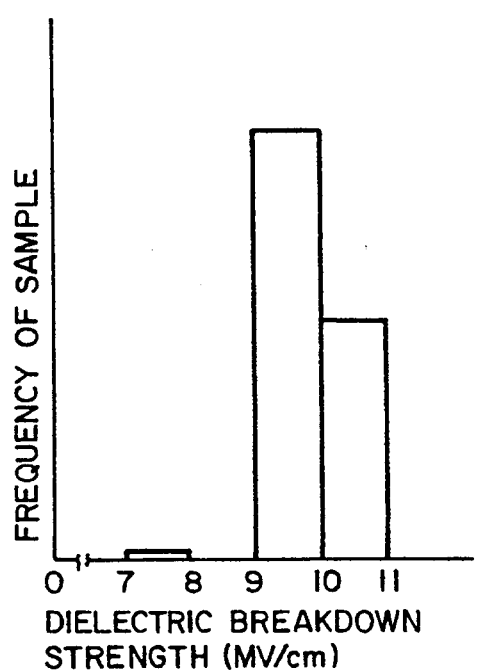
FIGS. 5a and 5b are graphs showing a relationship between dielectric breakdown strength and frequency of sample.
Figure 5B:
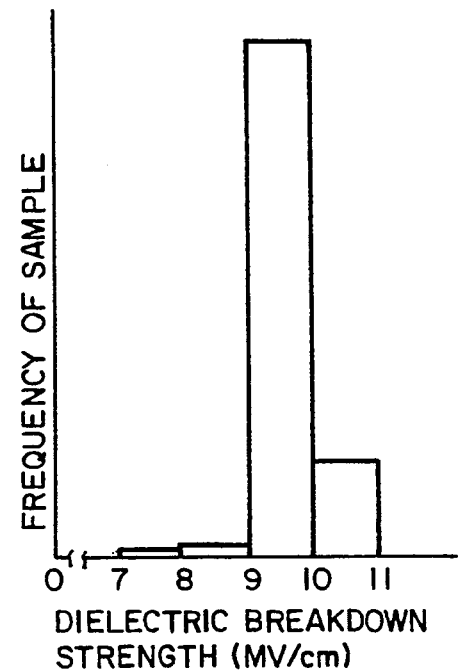

Then, dielectric breakdown strength of the capacitors made by the present invention was measured. The dielectric breakdown strength means the electric field strength that breaks down or destroys the dielectric film of a capacitor. FIG. 5a and FIG. 5b are frequency distribution charts showing the measurement results of it according to the present invention and the prior art in case of the diffusion method, respectively. In the charts, abscissas shows dielectric breakdown strength and ordinates show a relative frequency of measured samples. The relative frequency of samples means the ratio in number of sampled within a certain range to the total sample. As shown in the figures, relative frequency of the samples having dielectric breakdown strength larger than 9 MV/cm are 98% according to the present invention and 92% according to the diffusion method of the prior art, respectively. Consequently, the present invention can improves the insulating characteristic of the capacitor. In addition, according to the present embodiment, as the bottom electrode 5 can be formed with improved step coverage and uniformity, the insulating film 6 can also deposited with uniformity. Accordingly, decrease in the dielectric breakdown strength, caused by local electric field concentration at an extreme thin portion of the film 6, can be avoided. In addition, cut the film 6 itself also avoided.

Figure 6A:
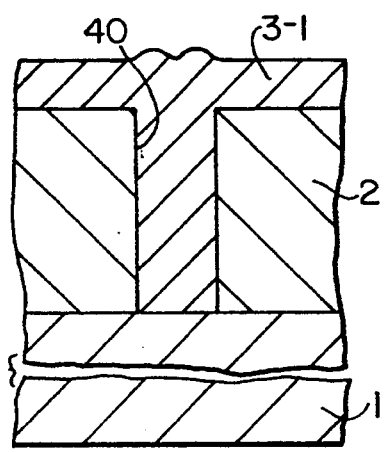
FIG. 6a and FIG. 6b are sectional views showing steps for fabricating a contact structure as another application of the present invention.
Figure 6B:
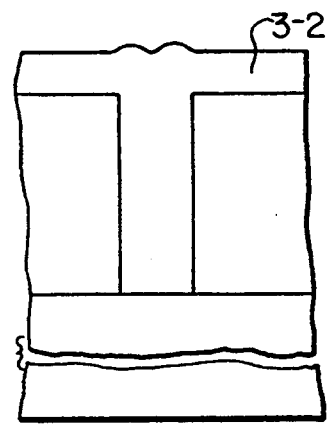

Referring to FIG. 6 representative of another application of the invention, a contact hole 40 having a diameter of 0.4 $\mu m$ is formed in a silicon oxide film 2 with thickness of 1 $\mu m$ which is formed on a silicon substrate 1. Thereafter, an amorphous silicon film 3 is deposited to fill the contact hole 40 and extend over the oxide film 2 while doping impurities into the film 3 by the method described above. The heat treatment is then performed at temperature of 900° C. for 20 minutes. As a result, the amorphous silicon film 3-1 is converted into a polysilicon film 3-2, as shown in FIG. 6b. The polysilicon film 3-2 is thereafter subject to the selective etching process to form an interconnection wiring layer. Since the silicon film 3-1 has a good step coverage, there occurs no void in the contact hole 40.

Figure 1B:
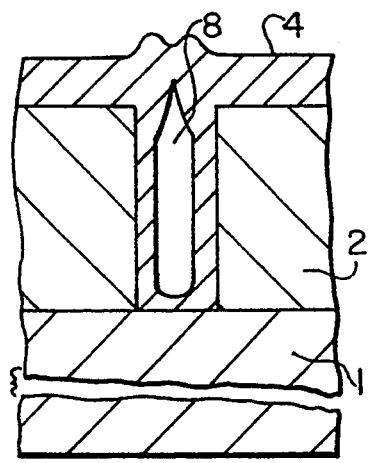

On the other hand, in the case of directly depositing a polycrystalline silicon film 4 in the contact hole, as shown in FIG. 1b, since the film 4 thus deposited has a poor step coverage, a void 8 is generated in the contact hole. The void 8 results in increase of a resistance value between the silicon substrate and polycrystalline silicon film. In experiment, it was 1.5 k$\Omega$. In contrast, the device shown in FIG. 6 has a resistance value of 450 $\Omega$.

The crystallizations of amorphous silicon can be performed at temperature of 600° to 1000° C. However, it is not practical use to perform it at temperature below 600° C. because it requires a long time to crystallize. On the other hand, in case of high temperature heat treatment, there generates undesirable diffusion from the amorphous silicon film to underlying substrate or impurity diffusion at the other portions. Therefore, considering a harmful effect on semiconductor devices caused by the heat, it is preferable for the temperature of the heat treatment below 1000° C.

Moreover, regarding to control resistivity, as it is used for electrodes, it is preferable to be low resistance. Polycrystalline silicon films having a low resistivity smaller than 10 m$\Omega$·cm may be used for a contact structure, as the preferable resistivity varies with a contact hole size or a electrodes size of semiconductor devices. In fact, the resistivity of the polycrystalline silicon film suffered the heat treatment according to the deposition condition of the present embodiment is in low such as 0.55 m$\Omega$·cm.

Although the invention has been described with reference to specific embodiment, this description is not meant to be construed in a limited sense. Various modifications of the disclosed embodiment will become apparent to persons skilled in the art upon reference to the description of the invention. It is therefore that the appended claims will cover any modifications or embodiments as fall within the true scope of the invention.

What is claimed is:

1. A method of fabricating a semiconductor device having a capacitor, comprising the steps of:
   forming an insulating film on a semiconductor substrate,
   selectively forming a trench in said insulating film to expose a part of said semiconductor substrate, said trench being defined by a side wall surface of said insulating film, said insulating film further having a top surface extending continuously from said side wall surface, depositing a first amorphous silicon film to partially fill said trench while doping impurities into said first amorphous silicon film, said first amorphous silicon film thereby having a first portion formed on said part of said semiconductor substrate, a second portion formed on said side wall surface of said insulating film and elongated continuously from said first portion and a third portion formed on said top surface of said insulating film and elongated continuously from said second portion, forming a dielectric film on said first amorphous silicon film to cover said first, second and third portions of said first amorphous silicon film, depositing a second amorphous silicon film on said dielectric film to cover said first, second and third portions of said first amorphous silicon film in isolation therefrom by said dielectric film while doping impurities into said second amorphous silicon film, and carrying out heat treatment to convert said first and second amorphous silicon films into first and second polycrystalline silicon films, respectively, said first and second polycrystalline silicon films serving as first and second electrodes of said capacitor, respectively, and said dielectric film serving as a dielectric film of said capacitor.

2. The method as claimed in claim 1, wherein each of said step of depositing a first amorphous silicon film and said step of depositing a second amorphous silicon film is carried out by a chemical vapor deposition method in which a silane gas is employed as a source gas and a deposition temperature is in a range of 450° to 550° C.

3. The method as claimed in claim 2, wherein said step of carrying out heat treatment is performed at a temperature in a range of 600° to 1000° C.

4. The method as claimed in claim 1, wherein each of said step of depositing a first amorphous silicon film and said step of depositing a second amorphous silicon film is carried out by a chemical vapor deposition method in which a disilane ($Si_2H_6$) gas is employed as a source gas and a deposition temperature is in a range of 450° to 550° C.

* * * * *